(12) United States Patent
Tai

(10) Patent No.: US 7,906,829 B2
(45) Date of Patent: Mar. 15, 2011

(54) SEMICONDUCTOR DEVICE HAVING FIRST AND SECOND INSULATION SEPARATION REGIONS

(75) Inventor: Akira Tai, Okazaki (JP)

(73) Assignee: Denso Corporation, Kariya (JP)

( * ) Notice: Subject to any disclaimer, the term of this patent is extended or adjusted under 35 U.S.C. 154(b) by 1159 days.

(21) Appl. No.: 11/447,021

(22) Filed: Jun. 6, 2006

(65) Prior Publication Data

US 2006/0278950 A1    Dec. 14, 2006

(30) Foreign Application Priority Data

Jun. 13, 2005    (JP) .................................. 2005-172680

(51) Int. Cl.
*H01L 21/70*    (2006.01)

(52) U.S. Cl. ........ 257/506; 257/500; 257/510; 257/526; 257/E21.564

(58) Field of Classification Search .................. 257/354, 257/506, 526

See application file for complete search history.

(56) References Cited

U.S. PATENT DOCUMENTS

| | | | |
|---|---|---|---|
| 5,442,223 A * | 8/1995 | Fujii ............................. | 257/506 |
| 5,446,437 A | 8/1995 | Bantien et al. | |
| 6,114,768 A * | 9/2000 | Gaul et al. ..................... | 257/777 |
| 6,439,514 B1 * | 8/2002 | Yamaguchi et al. ........... | 257/500 |
| 6,490,915 B2 | 12/2002 | Yamada et al. | |
| 6,531,738 B1 * | 3/2003 | Uemoto et al. ................ | 257/347 |
| 6,559,505 B1 * | 5/2003 | Fallica .......................... | 257/350 |
| 6,605,853 B2 | 8/2003 | Imai et al. | |
| 6,891,208 B2 * | 5/2005 | Leonardi ....................... | 257/173 |

FOREIGN PATENT DOCUMENTS

| | | |
|---|---|---|
| JP | A-7-297273 | 11/1995 |
| JP | A-9-139422 | 5/1997 |
| JP | A-2001-012985 | 1/2001 |
| JP | A-2001-345420 | 12/2001 |

OTHER PUBLICATIONS

Muth et al., Werner. "Bias Temperature Instability Assessment of N- and P-Channel MOS Transistors Using a Polysilicon Resistive Heated Scribe Lane Test Structure." *Microelectronics Reliability.* vol. 44 (2004): pp. 1251-1262.

Notice of Reason for Refusal mailed on May 25, 2010 in the corresponding Japanese application No. 2005-172680 (and English translation).

\* cited by examiner

*Primary Examiner* — Kenneth A Parker
*Assistant Examiner* — Jose R Diaz
(74) *Attorney, Agent, or Firm* — Posz Law Group, PLC

(57) ABSTRACT

A semiconductor device includes: a semiconductor substrate having a first surface and a second surface; a first insulation separation region disposed on the first surface of the semiconductor substrate; a second insulation separation region surrounded with the first insulation separation region and electrically isolated from the first insulation separation region; a semiconductor element disposed in the second insulation separation region; and an electrode connecting to the first insulation separation region for energizing and generating heat in the first insulation separation region. The first insulation separation region functions as a heater so that the semiconductor element in the second insulation separation region is locally heated.

20 Claims, 4 Drawing Sheets

SEMICONDUCTOR DEVICE HAVING FIRST AND SECOND INSULATION SEPARATION REGIONS

CROSS REFERENCE TO RELATED APPLICATION

This application is based on Japanese Patent Application No. 2005-172680 filed on Jun. 13, 2005, the disclosure of which is incorporated herein by reference.

FIELD OF THE INVENTION

The present invention relates to a semiconductor device having first and second insulation separation regions.

BACKGROUND OF THE INVENTION

A semiconductor device that can be used at a constant temperature by being locally heated is described, for example, in Microelectronics Reliability 44 (2004), pages 1251-1262.

FIGS. 4A and 4B show the semiconductor device disclosed in the above prior art, wherein FIG. 4A is a schematic top view of a semiconductor device 90, and FIG. 4B is a schematic cross section view along a line IVB-IVB in FIG. 4A.

In the semiconductor device 90 shown in FIGS. 4A and 4B, a heater 3 formed by a polysilicon film is disposed on a silicon substrate 1 via a thick oxide film 2. The heater 3 as a polysilicon film is applied with current to generate heat, thereby a MOS transistor 9 formed on a surface part of the silicon substrate 1 is locally heated to be able to be used at a constant temperature. In the semiconductor device 90 shown in FIGS. 4A and 4B, a metal resistor 5 formed via a dielectric film 4 is operated as a temperature sensor to control heat generation of the heater 3 (temperature of the MOS transistor 9).

Since the MOS transistor 9 in the semiconductor device 90 is heated by the heater 3 and thus subjected to temperature control, it can be used at a constant temperature. However, the heater 3 formed by the polysilicon film is formed on the thick oxide film 2, causing large heat radiation loss to the outside. Therefore, in the semiconductor device 90 in FIGS. 4A and 4B, even if the heater 3 is operated to generate heat for increasing temperature to 540° C. at the maximum, the MOS transistor 9 formed on the surface-part of the silicon substrate 1 can be heated to at most 250° C. On the other hand, in order to evaluate reliability, high temperature of about 400° C. is necessary for varying characteristics of the MOS transistor 9 formed on the silicon substrate 1 in about several hours in the high-temperature accelerated test. Therefore, a heating structure provided in the semiconductor device 90 in FIGS. 4A and 4B can not provide sufficient temperature necessary for the high-temperature accelerated test and therefore can not be used for evaluation of reliability of the MOS transistor 9.

Furthermore, in the semiconductor device 90 in FIGS. 4A and 4B, the metal resistor 5 as the temperature sensor is formed via the dielectric film 4 formed on the heater 3. Therefore, the MOS transistor 9 formed on the surface part of the silicon substrate 1 is separated from the temperature sensor 5, consequently temperature of the MOS transistor 9 can not be accurately monitored.

SUMMARY OF THE INVENTION

In view of the above-described problem, it is an object of the present disclosure to provide a semiconductor device having first and second insulation separation regions.

According to an aspect of the present disclosure, a semiconductor device includes: a semiconductor substrate having a first surface and a second surface; a first insulation separation region disposed on the first surface of the semiconductor substrate; a second insulation separation region surrounded with the first insulation separation region and electrically isolated from the first insulation separation region; a semiconductor element disposed in the second insulation separation region; and an electrode connecting to the first insulation separation region for energizing and generating heat in the first insulation separation region.

In the above device, the first insulation separation region functions as a heater. The first insulation separation region is energized by the electrode. Thus, the semiconductor element in the second insulation separation region surrounded with the first insulation separation region is locally heated. In this construction, the first insulation separation region as the heater is disposed on the surface portion of the semiconductor substrate, the surface portion on which the semiconductor element as an object of heating is disposed. Further, the first insulation separation region surrounds the semiconductor element. Thus, heat radiation loss radiating to the outside of the device becomes small. Accordingly, the semiconductor element is effectively and sufficiently heated up to 400° C. and more. Thus, a high-temperature accelerated test at a temperature equal to or higher than 400° C. is easily performed. Further, reliability test for the semiconductor element at the temperature equal to or higher than 400° C. during a few hours is also performed. Here, the high-temperature accelerated test may be performed to a wafer, in which the device is formed. Alternatively, the high-temperature accelerated test may be performed to a chip, on which the device is disposed. The wafer is divided into multiple chips. Further, the semiconductor element may be operated under a predetermined constant temperature.

Thus, the semiconductor element can be heated up to the temperature equal to or higher than 400° C., and further, the device can be used under high temperature. Furthermore, the high-temperature accelerated test can be performed to the device.

Alternatively, the semiconductor substrate may be a SOI semiconductor substrate having an embedded insulation film, and each of the first and second insulation separation regions may be disposed in a trench of the SOI semiconductor substrate, the trench which reaches the embedded insulation film. Further, the device may further include a second electrode. The SOI semiconductor substrate may further include a support layer disposed on the embedded insulation film and opposite to the SOI layer, and the second electrode may be disposed on the support substrate for energizing and generating heat in the support layer.

Alternatively, the device may further include: a plurality of second insulation separation regions; and a plurality of semiconductor elements. Each semiconductor element is disposed in each second insulation separation region, respectively. Further, a part of the semiconductor elements may provide a plurality of temperature sensors, and the part of the second insulation separation regions, the part in each of which the temperature sensor is disposed, surrounds a residual part of the second insulation separation regions, the residual part in each of which the semiconductor element other than the temperature sensor is disposed.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

Figure 1A:
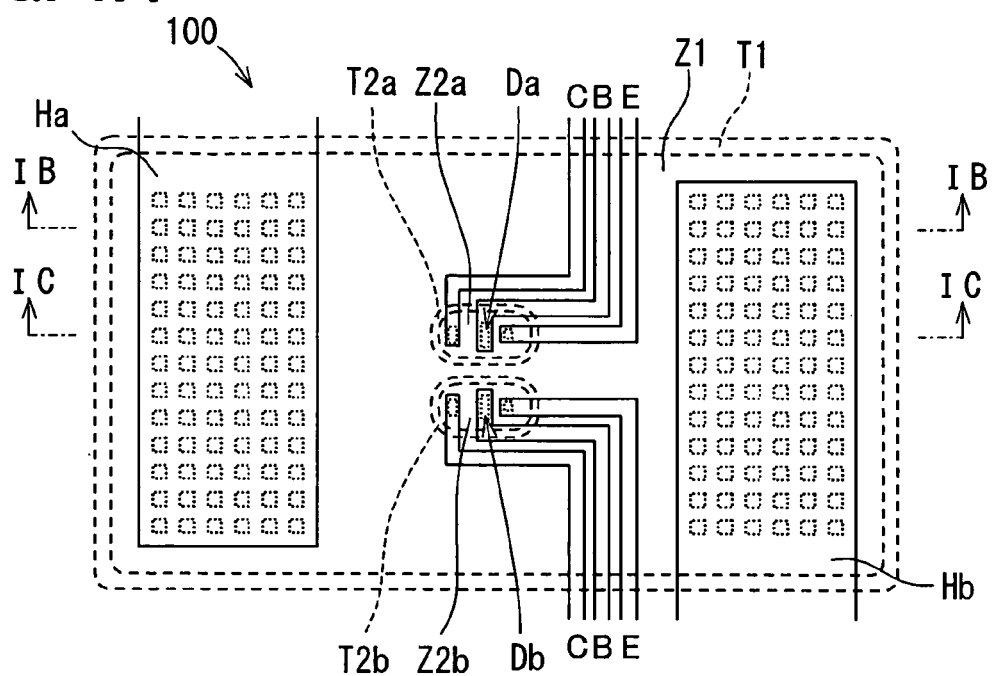
FIG. 1A is a plan view showing a semiconductor device according to a first embodiment of the present invention.
Figure 1B:
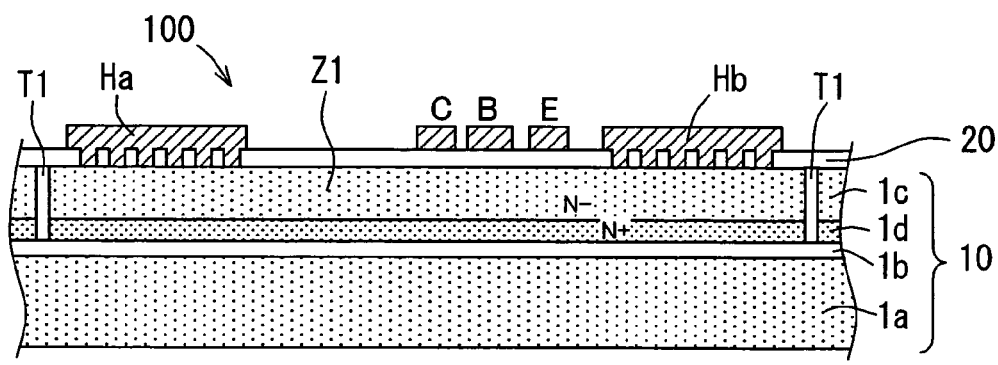
FIG. 1B is a cross sectional view showing the device taken along line IB-IB in FIG. 1A.
Figure 1C:
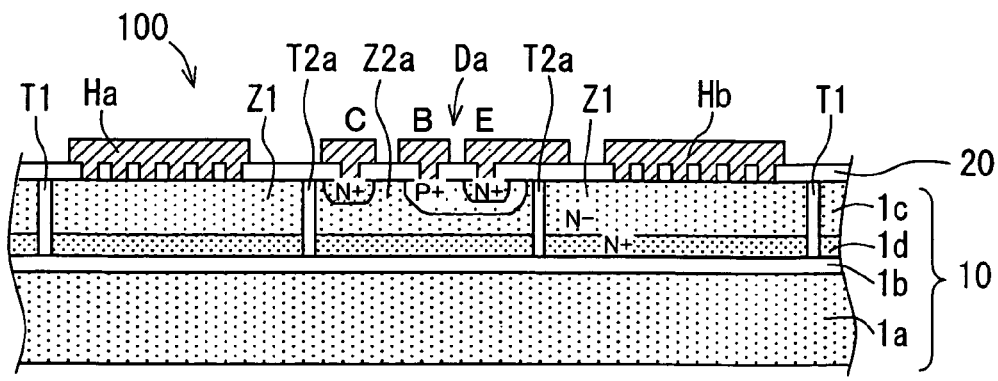
FIG. 1C is a cross sectional view showing the device taken along line IC-IC in FIG. 1A.

FIGS. 1A to 1C show an example of a semiconductor device of embodiments of the invention. FIG. 1A is a schematic top view of a semiconductor device 100. FIG. 1B is a schematic section view along a dashed line IB-IB of FIG. 1A. FIG. 1C is a schematic section view along a dashed line IC-IC of FIG. 1A.

The semiconductor device 100 shown in FIGS. 1A to 1C has a first isolation region Z1 formed on a surface part at a main surface side of a semiconductor substrate 10, and second isolation regions Z2a, Z2b that are enclosed by the first isolation region Z1 and isolated from the first isolation region Z1.

Semiconductor elements Da, Db are formed in the second isolation regions Z2a, Z2b. The semiconductor elements Da, Db in the semiconductor device 100 in FIGS. 1A to 1C are NPN bipolar transistors. Electrodes Ha, Hb for applying current to the first isolation region Z1 for heat generation are connected to the first isolation region Z1 via an insulating film 20 formed on the semiconductor substrate 10.

As shown in FIGS. 1A and 1B, the semiconductor substrate 10 is a semiconductor substrate in a SOI (Silicon On Insulator) structure having an embedded insulating film 1b, which includes a support substrate 1a, the embedded insulating film 1b, and an SOI layer 1c (N−). A high concentration layer 1d (N+) is formed on the embedded insulating film 1b in the SOI layer 1c to improve characteristics of the semiconductor elements Da, Db.

The first isolation region Z1 and the second isolation regions Z2a, Z2b are defined by isolation trenches T1, T2a and T2b each of which reaches to the embedded insulating film 1b. The isolation trenches T1, T2a and T2b, each of which reaches to the embedded insulating film 1b, can divide the SOI layer 1c on the embedded insulating film 1b into the first isolation region Z1 and the second isolation regions Z2a, Z2b and securely isolate them from each together. Moreover, the SOI layer 1c in the first isolation region Z1 can be applied with current for heat generation and thus operated as a heater, so that the semiconductor elements Da, Db formed in the SOI layer 1c in the second isolation regions Z2a, Z2b can be efficiently heated from the surroundings.

Figure 4A:
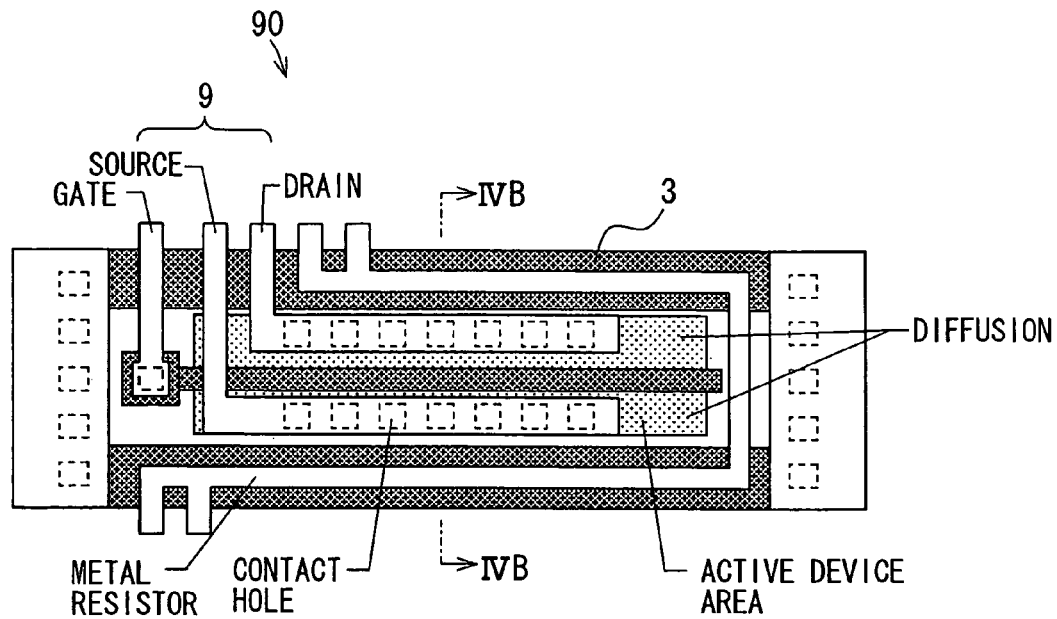
FIG. 4A is a plan view showing a semiconductor device according to a prior art.
Figure 4B:
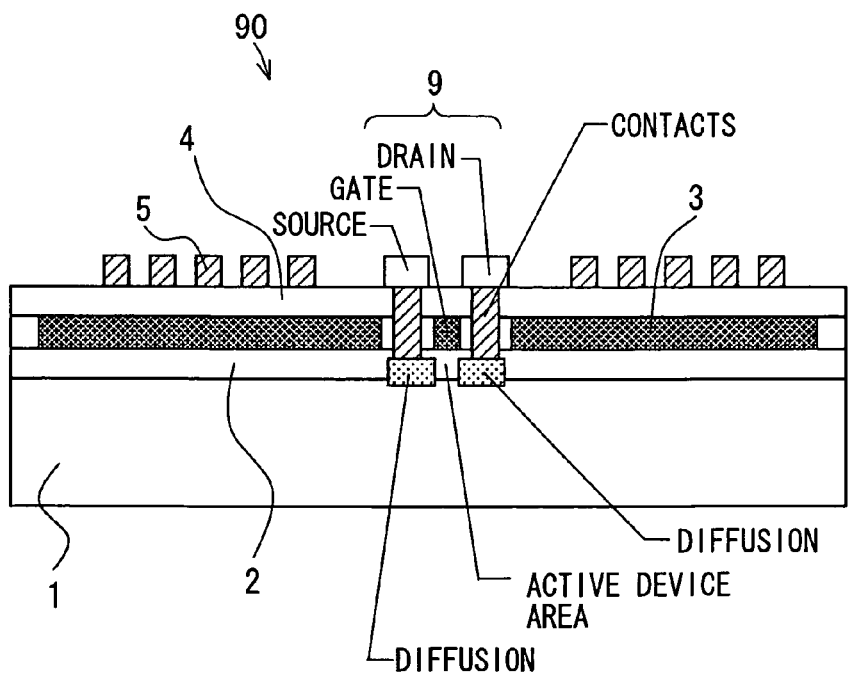
FIG. 4B is a cross sectional view showing the device taken along line IVB-IVB in FIG. 4A.

As above, in the semiconductor device 100 shown in FIGS. 1A to 1C, the first isolation region Z1 can be applied with current for heat generation and thus operated as the heater, so that the semiconductor elements Da, Db formed in the second isolation regions Z2a, Z2b in the first isolation region Z1 can be locally heated. In a structure of the semiconductor device 100 shown in FIGS. 1A to 1C, unlike the structure of the semiconductor device 90 in the related art shown in FIGS. 4A and 4B, the first isolation region Z1 that operates as the heater is formed on the surface part of the same semiconductor substrate 10 similarly as the semiconductor elements Da, Db as heating objects in a manner of enclosing the semiconductor elements Da, Db. Thus, heat radiation loss to the outside can be made small, and the semiconductor elements Da, Db as the heating objects can be efficiently heated to high temperature of 400° C. or more from the surroundings. Consequently, for example, the high-temperature accelerated test of the semiconductor elements Da, Db can be performed at 400° C. or more, and reliability of the semiconductor elements Da, Db can be evaluated in about several hours. The high-temperature accelerated test may be carried out in a stage of a wafer before it is cut into chips during production, or may be carried out after it has been cut into chips of the semiconductor device 100. It is obvious that the semiconductor device 100 of FIGS. 1A to 1C can be used in a way that the semiconductor elements Da, Db are operated with being set at a constant temperature.

As above, the semiconductor device 100 of FIGS. 1A to 1C can locally heat the semiconductor elements Da, Db formed on the surface part of the semiconductor substrate 10 to 400° C. or more, and can be subjected to the high-temperature accelerated test or can be used at high temperature.

While the semiconductor device 100 shown in FIGS. 1A to 1C uses the semiconductor substrate 10 in the SOI structure, the semiconductor device of the embodiments of the invention is not limited to this, and as described later, a typical semiconductor substrate of silicon (Si), or an optional semiconductor substrates other than that may be used. Moreover, the electrodes Ha, Hb connected to the first isolation region Z1 may be formed of aluminum (Al) that is the same material as a wiring material of the semiconductor device 100, or may be formed of one of tungsten (W), titanium (Ti), high-melting-point metal silicide, and polysilicon, which have high heat resistance at high temperature.

In the semiconductor device using the semiconductor substrate in the SOI structure and the isolation trenches such as the semiconductor device 100 shown in FIGS. 1A to 1C, the isolation trench T1 forming the first isolation region Z1 shown in FIGS. 1A to 1C can be made to be 2 or more, multiple isolation trenches. Thus, compared with the semiconductor device 100 of FIGS. 1A to 1C having the single isolation trench T1, heat radiation loss in a lateral direction associated with heat generation of the SOI layer 1c in the first isolation region Z1 can be more suppressed.

While the high concentration layer 1d is formed on the embedded insulating film 1b in the semiconductor device 100 shown in FIGS. 1A to 1C, an impurity concentration of the SOI layer 1c may be constant in a depth direction without forming the high concentration layer 1d. Thus, uniform heat generation of the SOI layer 1c in the first isolation region Z1 can be caused.

Furthermore, in the semiconductor device 100 shown in FIGS. 1A to 1C, at a back side of the semiconductor substrate 10, that is, on the support substrate 1a under the embedded insulating film 1b, electrodes for applying current to the support substrate 1a for heat generation may be formed to be connected to the substrate similarly as the electrodes Ha, Hb on the main surface side. Thus, the support substrate 1a can be also operated as a heater, consequently the semiconductor elements Da, Db formed in the SOI layer 1c in the second isolation regions Z2a, Z2b can be heated not only from the surroundings but also from the lower side. The electrode connected to the support substrate 1a may be formed of aluminum (Al) that is the same material as a wiring material of the semiconductor device 100, or may be formed of one of tungsten (W), titanium (Ti), the high-melting-point metal silicide, and polysilicon, which have high heat resistance at high temperature, similarly as the electrodes Ha, Hb on the main surface side.

In the semiconductor device 100 of FIGS. 1A to 1C, there are two second isolation regions Z2a, Z2b (thus, two semiconductor elements Da, Db) in the first isolation region Z1. However, the semiconductor device of the embodiments is not limited to this, and the number of the second isolation regions (thus, the number of semiconductor elements) in the first isolation region may be one, or any plural number of at least 3. Moreover, in the semiconductor device 100 of FIGS. 1A to 1C, the same NPN bipolar transistors are formed as the semiconductor elements Da, Db in the two second isolation regions Z2a, Z2b. All the semiconductor elements in a plurality of second isolation regions may be the same semiconductor elements in this way, or without limiting to this, different semiconductor elements may be formed in the plurality of second isolation regions respectively.

When a plurality of second isolation regions Z2a, Z2b (thus, semiconductor elements Da, Db) are present in the first isolation region Z1 as in the semiconductor device 100 shown in FIGS. 1A to 1C, a semiconductor element formed in at least one of the second isolation regions (for example, semiconductor element Db formed in the second isolation region Z2b) can be used for a temperature sensor element. Accordingly, heat generation temperature of the first isolation region Z1 can be controlled based on a signal from the temperature sensor element Db.

In this way, in the semiconductor device 100 of FIGS. 1A to 1C, the signal from the temperature sensor element Db formed in the single second isolation region Z2b is used for on-demand feedback to current flowing into the first isolation region Z1 that operates as the heater, so that feedback control of the heat generation temperature of the first isolation region Z1 is performed. Thus, the heat generation temperature of the first isolation region Z1, and consequently temperature of the semiconductor element Da formed in another second isolation region Z2a can be controlled to be constant at high temperature. In the semiconductor device 100 of FIGS. 1A to 1C, unlike the semiconductor device 90 of FIGS. 4A and 4b, the temperature sensor element Db for measuring temperature and the semiconductor element Da as an evaluation object are arranged in the same first isolation region Z1 that operates as the heater. Therefore, temperature of the semiconductor element Da can be accurately monitored, and heat generation temperature of the heater (thus, temperature of the semiconductor element) can be accurately controlled.

The semiconductor device 100 of FIGS. 1A to 1C, which uses the semiconductor element Db formed in the second isolation region Z2b as the temperature sensor element as above, can accurately monitor temperature of the semiconductor element Da formed in the surface part of the semiconductor substrate 10, and heat the semiconductor element Da by the first isolation region Z1 that operates as the heater, and consequently accurately control the temperature of the element at a predetermined temperature. Thus, the semiconductor device 100 can be subjected to the high-temperature accelerated test or can be used at a constant temperature with high setting accuracy.

While the single temperature sensor element Db is given in the semiconductor device 100 of FIGS. 1A to 1C, when a plurality of temperature sensor elements are given, respective second isolation regions in which the temperature sensor elements are formed are preferably configured such that they are disposed enclosing the second isolation region in which the semiconductor element as the evaluation object other than the temperature sensor elements is formed. For example, the second isolation regions in which the temperature sensor elements are formed are disposed in all the four directions enclosing the second isolation region in which the semiconductor element as the evaluation object other than the temperature sensor elements is formed, thereby temperature of the semiconductor element as the evaluation object can be accurately set.

The semiconductor element used for the temperature sensor element as above can be, for example, one of a diffusion resistance, diode, bipolar transistor, and MOS transistor. The diffusion resistance can monitor temperature using a characteristic of resistance to temperature. A semiconductor element in which a PN junction is formed such as the diode, bipolar transistor, or MOS transistor can monitor temperature using forward direction voltage (Vf) of the PN junction. Alternatively, semiconductor devices other than the above may be used. However, the semiconductor element used as the temperature sensor element is preferably equal to the semiconductor element as the evaluation object. Thus, temperature of the semiconductor element as the evaluation object can be more accurately monitored.

When the semiconductor element formed in the second isolation region is not used for the temperature sensor element, a temperature sensor formed by a metal resistance may be disposed on the semiconductor substrate 10 via an insulating film.

Figure 2A:
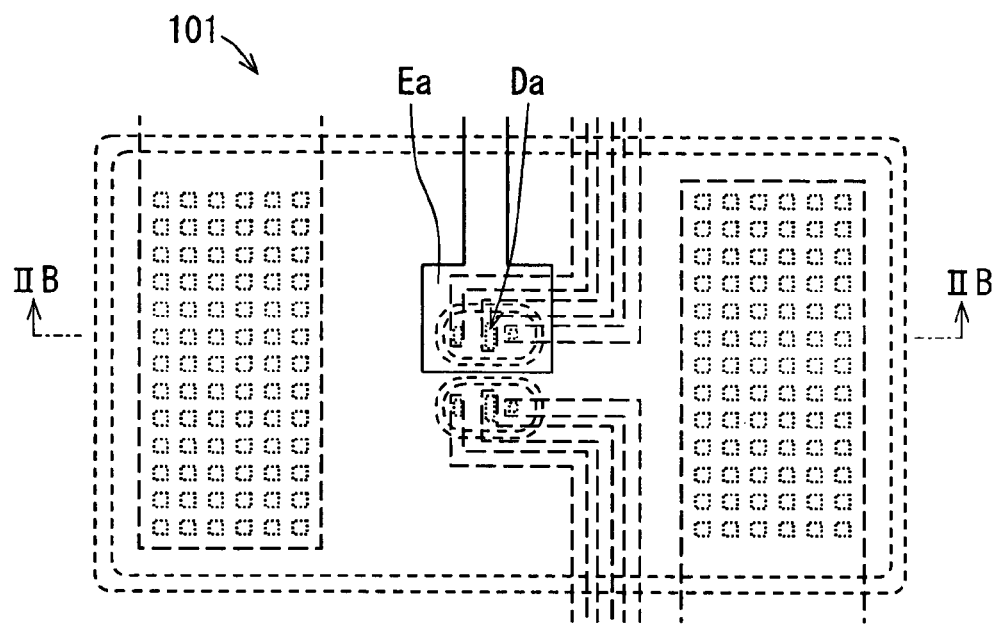
FIG. 2A is a plan view showing a semiconductor device according to a second embodiment of the present invention.
Figure 2B:
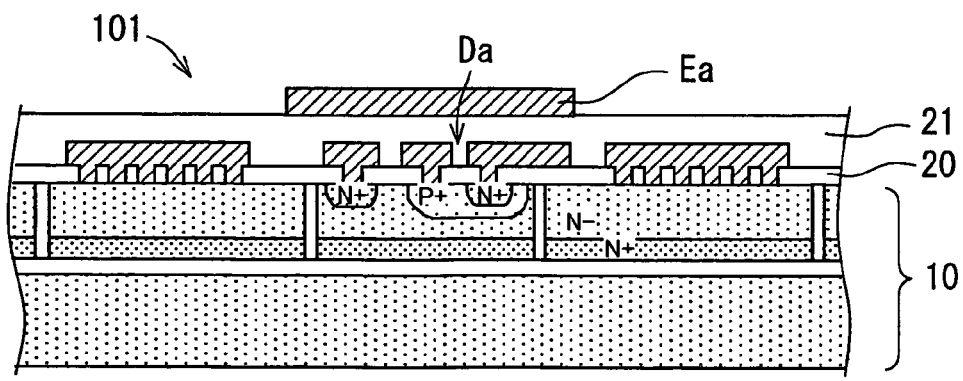
FIG. 2B is a cross sectional view showing the device taken along line IIB-IIB in FIG. 2A.

FIGS. 2A and 2B show an example of another semiconductor device of the embodiments of the invention. FIG. 2A is a schematic top view of a semiconductor device 101. FIG. 2B is a schematic section view along a dashed line IIB-IIB of FIG. 2A. In the semiconductor device 101 of FIGS. 2A and 2B, the same portions as in the semiconductor device 100 of FIGS. 1A to 1C are marked with the same references.

In the semiconductor device 101 shown in FIGS. 2A and 2B, in addition to a configuration of the semiconductor device 100 of FIGS. 1A to 1C, an interlayer insulating film 21 is formed on a surface part at a main surface side of the semiconductor substrate 10. Moreover, an electrode Ea for producing an electric field in the interlayer insulating film 21 is disposed on the interlayer insulating film 21 covering the semiconductor element Da.

In the semiconductor device 101 of FIGS. 2A and 2B, voltage is applied to the electrode Ea disposed in the interlayer insulating film 21 to produce the electric field in the interlayer insulating film 21, consequently transfer of movable charges in the interlayer insulating film 21 can be accelerated by voltage (electric field). Accordingly, in the high-temperature accelerated test, in addition to the reliability evaluation of the semiconductor element Da, dielectric durability of the interlayer insulating film 21 can be evaluated at the same time.

Moreover, as the semiconductor device 101 shown in FIGS. 2A and 2B, when the interlayer insulating film 21 is formed on the surface part at the main surface side of the semiconductor substrate 10, the heater formed by the polysilicon film or the aluminum (Al) film can be disposed on the interlayer insulating film 21. According to this, the semiconductor element formed in the second isolation region can be heated not only from the surroundings but also from an upper side.

Figure 3A:
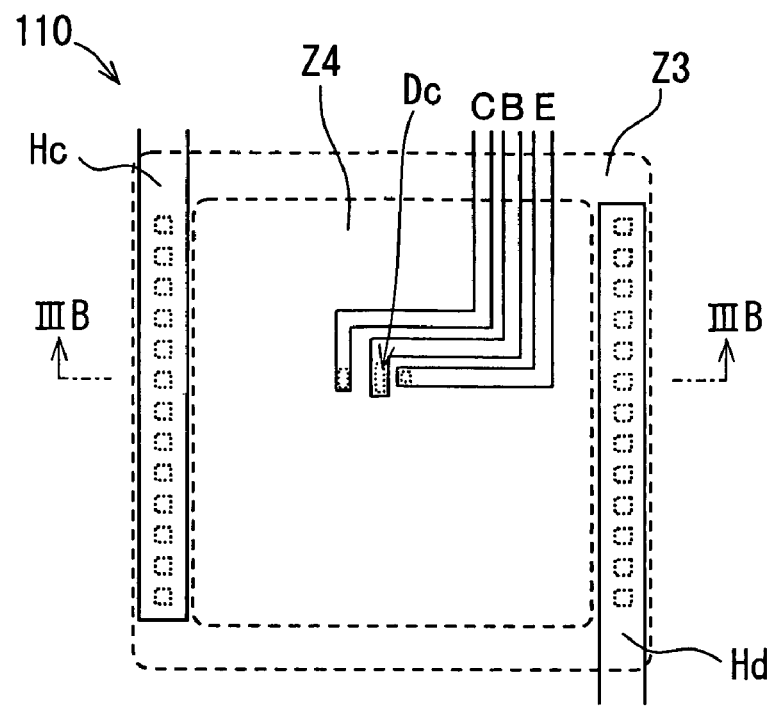
FIG. 3A is a plan view showing a semiconductor device according to a third embodiment of the present invention.
Figure 3B:
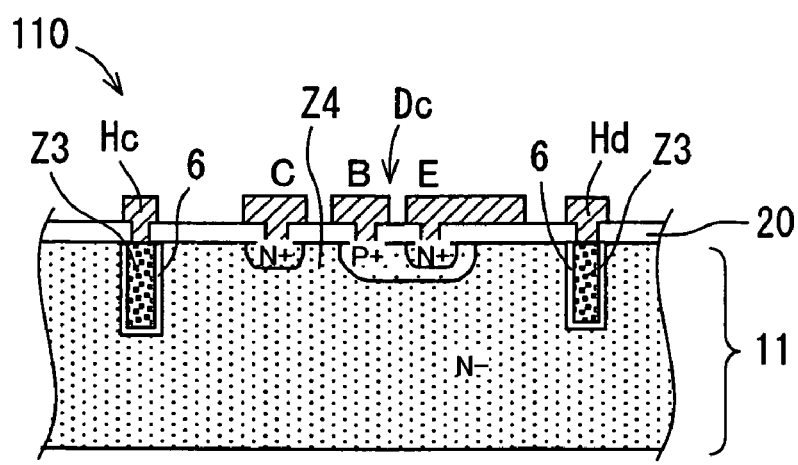
FIG. 3B is a cross sectional view showing the device taken along line IIIB-IIIB in FIG. 3A.

FIGS. 3A and 3B show an example of still another semiconductor device of the embodiments of the invention. FIG.

3A is a schematic top view of a semiconductor device 110. FIG. 3B is a schematic section view along a dashed line E-E' of FIG. 3A.

The semiconductor device 110 shown in FIGS. 3A and 3B has a first isolation region Z3 formed on a surface part at a main surface side of a semiconductor substrate 11, and a second isolation region Z4 that is enclosed by the first isolation region Z3 and isolated from the first isolation region Z3.

A semiconductor element Dc is formed in the second isolation region Z4. Moreover, electrodes Hc, Hd for applying current to the first isolation region Z3 for heat generation are connected to the first isolation region Z3 via an insulating film 20 formed on the semiconductor substrate 11.

In the semiconductor device 110 shown in FIGS. 3A and 3B, a trench is formed in the semiconductor substrate 11 of typical silicon (Si) or an optional material other than that, and the first isolation region Z3 that is operated as the heater is formed of polysilicon filled in the trench via a sidewall insulation film 6.

Again in the semiconductor device 110 of FIGS. 3A and 3B, the semiconductor element Dc in the second isolation region Z4 enclosed by the first isolation region Z3 formed of polysilicon via the sidewall insulating film 6 can be locally heated efficiently from the surroundings. In the semiconductor device 110, the first isolation region Z3 that is operated as the heater is formed of the polysilicon filled in the trench, and therefore space for the region can be small. Therefore, the semiconductor device 110 of FIGS. 3A and 3B can be reduced in size compared with the semiconductor device 100 of FIGS. 1A to 1C in which the first isolation region Z1 is formed by the SOI layer 1c.

A semiconductor device may be formed, in which a semiconductor substrate in an SOI structure having an embedded insulating film is used, a trench that reaches to the embedded insulating film is formed, and polysilicon filled in the trench is used as the first isolation region. In this case, similarly as in FIGS. 1A to 1C, a plurality of second isolation regions (thus, a plurality of semiconductor elements) isolated form one another can be formed in an SOI layer enclosed by the first isolation region formed of polysilicon filled in the trench.

As the semiconductor device 110 of FIGS. 3A and 3B, when the optional semiconductor substrate 11 is used, a heater formed by a polysilicon film or an aluminum (Al) film may be disposed on a back side of the semiconductor substrate 11 via an insulating film. Again in this case, the semiconductor element Dc formed in the second isolation region Z4 can be heated not only from the surroundings but also from the lower side.

The semiconductor devices 100, 101 and 110 shown in FIGS. 1A to 1C through FIG. 3B of the embodiments of the invention are preferably used when the semiconductor elements Da to Dc are gas sensors or oscillator-type elements which are desirably used at a constant temperature.

The semiconductor devices 100, 101 and 110 can be preferably used for monitoring the semiconductor elements Da to Dc formed in different positions on the same wafer in the high-temperature accelerated test.

Furthermore, the semiconductor devices 100, 101 and 110 includes the first isolation regions Z1 and Z3 which operate as the heater, so that the semiconductor elements Da to Dc are heated to be operated stably at a constant temperature. Therefore, they are preferably used also in the case that they are used in low temperature or at most room-temperature environment, for example, cryogenic environment such as space.

As hereinbefore, the semiconductor device of the embodiments of the invention can locally heat a semiconductor element formed on a surface part of a semiconductor substrate to 400° C. or more, and can accurately monitor temperature of the relevant semiconductor element, and consequently can be subjected to the high-temperature accelerated test or can be used at a constant temperature.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
a semiconductor substrate having a first surface and a second surface;
a first insulation separation region disposed on the first surface of the semiconductor substrate;
a second insulation separation region surrounded with the first insulation separation region and electrically isolated from the first insulation separation region;
a semiconductor element disposed in the second insulation separation region; and
a pair of electrodes connecting to, and disposed in, the first insulation separation region for energizing and generating heat in the first insulation separation region,
one of the pair of electrodes having an electric potential that is different from the electric potential of the other of the pair of electrodes such that the pair of electrodes applies current to the first insulation separation region.

2. The device according to claim 1, wherein
the semiconductor substrate is made of silicon.

3. The device according to claim 1, wherein
each electrode is made of aluminum, tungsten, titanium, high melting point metallic silicide or poly-crystalline silicon.

4. The device according to claim 1, wherein
the semiconductor substrate is a SOI semiconductor substrate having an embedded insulation film, and
each of the first and second insulation separation regions is disposed in a trench of the SOI semiconductor substrate, the trench reaching the embedded insulation film.

5. The device according to claim 4, wherein
the trench corresponding to the first insulation separation region includes a plurality of insulation separation trenches.

6. The device according to claim 4, wherein
the SOI semiconductor substrate further includes a SOI layer disposed on the embedded insulation film, and
the SOI layer has an impurity concentration, which is constant in a depth direction perpendicular to the SOI semiconductor substrate.

7. The device according to claim 4, further comprising:
a second electrode, wherein
the SOI semiconductor substrate further includes a support layer disposed on the embedded insulation film and opposite to the SOI layer, and
the second electrode is disposed on the support substrate for energizing and generating heat in the support layer.

8. The device according to claim 7, wherein
the second electrode is made of aluminum, tungsten, titanium, high melting point silicide or poly-crystalline silicon.

9. The device according to claim 1, wherein
the first insulation separation region is disposed in a trench of the semiconductor substrate through a sidewall insulation film, and
the first insulation separation region is made of poly-crystalline silicon.

10. The device according to claim 1, further comprising:
a heater disposed on the second surface of the semiconductor substrate through an insulation film, wherein
the heater is made of a poly-crystalline silicon film or an aluminum film.

11. The device according to claim 1, further comprising:
a third electrode disposed on the first surface of the semiconductor substrate through an interlayer insulation film, wherein
the third electrode covers the semiconductor element through the interlayer insulation film in order to generate electric field in the interlayer insulation film.

12. The device according to claim 1, further comprising:
a second heater disposed on the first surface of the semiconductor substrate through an interlayer insulation film, wherein
the second heater is made of poly-crystalline silicon or aluminum.

13. The device according to claim 1, further comprising:
a plurality of second insulation separation regions; and
a plurality of semiconductor elements, wherein
each semiconductor element is disposed in each second insulation separation region, respectively.

14. The device according to claim 13, wherein
each semiconductor element has a same construction.

15. The device according to claim 13, wherein
at least one of the semiconductor elements is a temperature sensor, and
temperature of the first insulation separation region is controlled by a signal outputted from the temperature sensor.

16. The device according to claim 13, wherein
a part of the semiconductor elements provides a plurality of temperature sensors, and
the part of the second insulation separation regions, the part in each of which the temperature sensor is disposed, surrounds a residual part of the second insulation separation regions, the residual part in each of which the semiconductor element other than the temperature sensor is disposed.

17. The device according to claim 15, wherein
the temperature sensor is a diffusion resistor, a diode, a bipolar transistor or a MOS transistor.

18. The device according to claim 1, wherein
the semiconductor element is a gas sensor or an oscillation type element.

19. The device according to claim 1, wherein
the device is disposed on a predetermined position of a wafer, and
the device is used for an accelerated test at high temperature in order to evaluate another semiconductor element disposed on another position of the wafer.

20. The device according to claim 1, wherein
the device is used in a temperature equal to or lower than a room temperature.

* * * * *